(12) United States Patent
Wang et al.

(10) Patent No.: US 9,891,518 B2
(45) Date of Patent: Feb. 13, 2018

(54) MASK

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Deshuai Wang, Beijing (CN); Lianjie Qu, Beijing (CN)

(73) Assignees: BOE Technology Group Co., Ltd., Beijing (CN); Beijing BOE Optoelectronics Technology Co., Ltd., Beijing (CN)

(*) Notice: Subject to any disclaimer, the term of this patent is extended or adjusted under 35 U.S.C. 154(b) by 37 days.

(21) Appl. No.: 14/547,399

(22) Filed: Nov. 19, 2014

(65) Prior Publication Data

US 2016/0018726 A1    Jan. 21, 2016

(30) Foreign Application Priority Data

Jul. 18, 2014    (CN) .......................... 2014 1 0345060

(51) Int. Cl.
*G03F 1/54*    (2012.01)
*G03F 1/00*    (2012.01)

(52) U.S. Cl.
CPC . *G03F 1/54* (2013.01); *G03F 1/00* (2013.01)

(58) Field of Classification Search
CPC ..... G03F 1/00; G03F 1/50; G03F 1/54; G03F 1/56
USPC ............................................................ 430/5
See application file for complete search history.

(56) References Cited

U.S. PATENT DOCUMENTS

| 5,821,013 | A | * | 10/1998 | Miller ................. G03F 7/70283 430/5 |
| 7,528,911 | B2 |  | 5/2009 | Kudo |
| 8,133,641 | B2 |  | 3/2012 | Kang et al. |
| 2003/0197182 | A1 | * | 10/2003 | Kim ..................... H01L 27/1214 257/72 |
| 2007/0247574 | A1 | * | 10/2007 | Kudo ................ G02F 1/133555 349/114 |
| 2008/0226993 | A1 | * | 9/2008 | Kim ....................... G02B 5/201 430/7 |
| 2012/0052420 | A1 | * | 3/2012 | Kang ....................... G03F 1/54 430/5 |
| 2015/0001530 | A1 | * | 1/2015 | Ishiga ................. H01L 27/1225 257/43 |

FOREIGN PATENT DOCUMENTS

| CN | 101063779 A | 10/2007 |
| CN | 101438386 A | 5/2009 |

(Continued)

OTHER PUBLICATIONS

Computer-generated translation of JP 2008-046623 (Feb. 2008).*

(Continued)

*Primary Examiner* — John A McPherson
(74) *Attorney, Agent, or Firm* — Collard & Roe, P.C.

(57) ABSTRACT

A mask, comprising an opaque region, a first semi-transparent region, and a second semi-transparent region. The transmittance of the second semi-transparent region is less than that of the first semi-transparent region. The mask solves the over-etching problem caused by the difference between the thicknesses of photoresist in different regions.

3 Claims, 2 Drawing Sheets

(56) References Cited

FOREIGN PATENT DOCUMENTS

JP   2000-066240 A      3/2000
JP   2008-046623 A  *   2/2008

OTHER PUBLICATIONS

Chinese Office Action in Chinese Application No. 201410345060.7, dated Mar. 31, 2017 with English translation.
Second Chinese Office Action in Chinese Application No. 201410345060.7, dated Sep. 19, 2017 with English translation.

* cited by examiner

MASK

CROSS REFERENCE TO RELATED APPLICATIONS

Applicants claim priority under 35 U.S.C. § 119 of Chinese Application No. 201410345060.7 filed on Jul. 18, 2014, the disclosure of which is incorporated by reference.

TECHINCAL FIELD

Embodiments of the present invention relate to a mask.

BACKGROUND

FIG. 1 is a schematic diagram of exposure process of semitransparent mask with large area. As shown in FIG. 1, a surface of a substrate 1 facing to a mask 4 has different heights in different regions since there is metal wire 2; the surface becomes a flat surface after it is coated with photoresist 3, and the surface coated with the photoresist 3 has uniform distance from a substrate 5 of the mask 4. Since the surface of the substrate 1 facing to the mask has different heights in different regions, the photoresist 3 coating each region of the surface of the substrate 1 facing to the mask has different thickness. As shown in FIG. 1, $H_1$ is a thickness of the photoresist 3 of semi-exposed region, $H_2$ is the thickness of the photoresist 3 of semi-exposed region, $H_3$ is the thickness of the photoresist 3 of unexposed region, wherein $H_2$ is less than $H_1$.

FIG. 2 is a distribution schematic diagram of photoresist of the developed substrate as shown in FIG. 1. As shown in FIG. 2, portions of the mask 4 opposite to the semi-exposed regions of the substrate 1 have same transmittance. After the photoresist 3 coated on the substrate 1 is exposed and developed, the photoresist 3 remained on the portion corresponding to $H_1$ has a thickness of $H_{11}$, the photoresist 3 remained on the portion corresponding to $H_2$ has a thickness of $H_{21}$; $H_{31}$ is the thickness of the photoresist 3 of the unexposed region, wherein $H_{21}$ is still less than $H_{11}$.

In subsequent processes, an ashing process is needed to be performed to the photoresist 3 in $H_{11}$ region and $H_{21}$ region, thereby to etch these two regions.

SUMMARY

Embodiments of the present invention provide a mask, comprising: an opaque region; a first semi-transparent region; and a second semi-transparent region; wherein transmittance of the second semi-transparent region is less than that of the first semi-transparent region.

In an example, a semi-transparent film layer is provided at portions of the substrate of the mask corresponding to the first semi-transparent region and the second semi-transparent region, the portions of semi-transparent film layer that cover the first semi-transparent region and the second semi-transparent region have same transmittance, and a light shielding layer is provided at the portion of the semi-transparent film layer covering the second semi-transparent region, and wherein the light shielding layer has a width less than resolution size of the exposure machine.

In an example, the light shielding layer is made of metal material.

In an example, the light shielding layer is made of black matrix material.

In an example, the light shielding layer has a width of 1-2 μm.

In an example, a first semi-transparent film is provided at the region of the substrate of the mask opposite to the first semi-transparent region; a second semi-transparent film is provided at the region of the substrate of the mask opposite to the second semi-transparent region, the transmittance of the first semi-transparent film is larger than that of the second semi-transparent film.

BRIEF DESCRIPTION OF THE DRAWINGS

Embodiments of the present invention will be described in more detail below with reference to the accompanying drawings to allow one of ordinary skill in the art to understand the present invention more clearly, and wherein.

DETAILED DESCRIPTION

Technical solutions according to the embodiments of the present invention will be described clearly and completely as below in conjunction with the accompanying drawings of embodiments of the present invention. It is to be understood that the described embodiments are only a part of but not all of exemplary embodiments of the present invention. Based on the described embodiments of the present invention, various other embodiments and variants can be obtained by those of ordinary skill in the art without creative labor and those embodiments and variants shall fall into the protection scope of the present invention.

Unless otherwise defined, all the technical and scientific terms used herein have the same meanings as commonly understood by one of ordinary skill in the art to which the present invention belongs. The terms, such as "first," "second" or the like, which are used in the description and the claims of the present application, are not intended to indicate any sequence, amount or importance, but for distinguishing various components. Also, the terms, such as "a/an," "one," "the/said" or the like, are not intended to limit the amount, but for indicating the existence of at lease one. The terms, such as "comprise/comprising," "include/including" or the like, are intended to specify that the elements or the objects stated before these terms encompass the elements or the objects and equivalents thereof listed after these terms, but not preclude other elements or objects. The terms, such as "On," "under," or the like, are only used to indicate relative position relationship, and when the position of the object which is described is changed, the relative position relationship may be changed accordingly.

Figure 1:
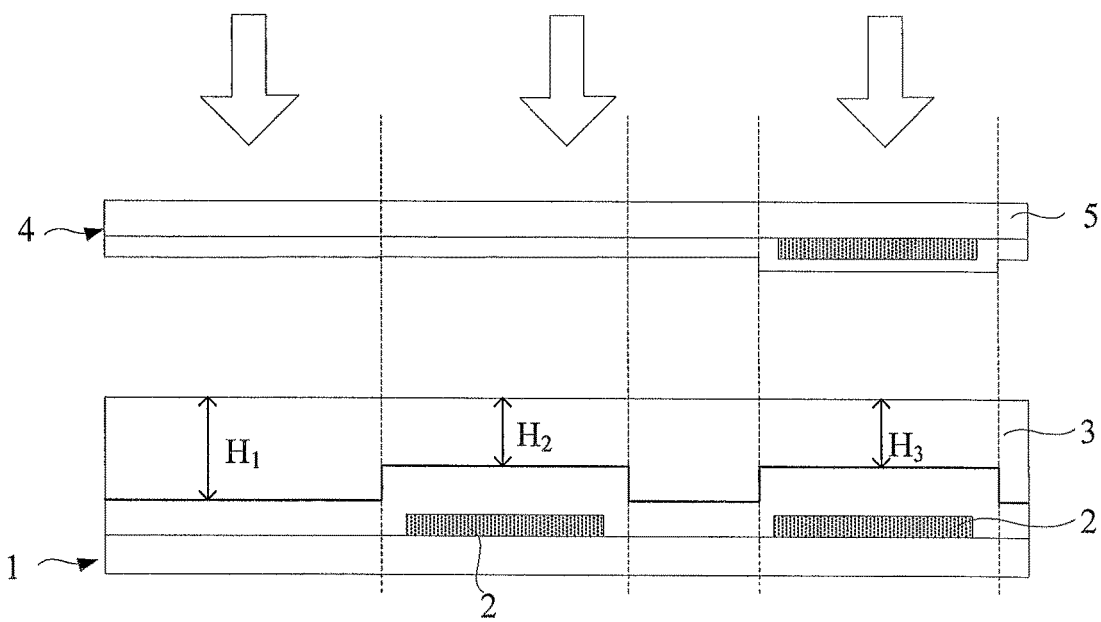
FIG. 1 is a schematic diagram of exposure process of a semitransparent mask with large area.
Figure 2:
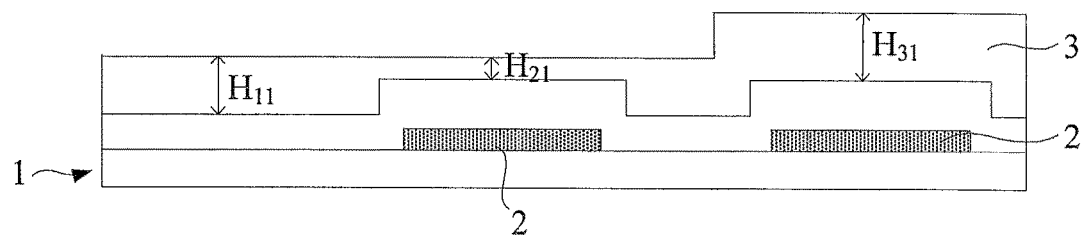
FIG. 2 is a distribution schematic diagram of photoresist of a developed substrate as shown in FIG. 1.

The inventor notices that, during the exposure process of the semitransparent mask as shown in FIGS. 1-2, in the manufacturing process of the substrate 1, it must ensure that the thickness $H_{11}$ of the photoresist 3 remained on $H_1$ region is not zero and the thickness $H_{21}$ of the photoresist 3 remained on $H_2$ region is not zero after the photoresist 3 coated on the substrate 1 is exposed and developed, but the thickness $H_{11}$ of the photoresist 3 remained on $H_1$ region is difficult to be controlled after the photoresist 3 coated on the substrate 1 is exposed and developed, which causes the following problems.

When the thickness $H_{11}$ of the photoresist 3 remained on $H_1$ region is thinner, the thickness $H_{21}$ of the photoresist 3 remained on $H_2$ region may be zero, thereby there is no photoresist 3 to protect an upper surface of the substrate 1 in this region, which may produce over-etching and result in badness in subsequent etching processes.

When the thickness $H_{11}$ of the photoresist 3 remained on $H_1$ region is thicker, all of the photoresist 3 remained on $H_3$ region may be ashed in a subsequent process for fully ashing the photoresist 3 having a thickness $H_{11}$ remained on $H_1$ region, thereby there is no photoresist 3 to protect the upper surface of the substrate 1 corresponding to $H_3$ region; it may produce over-etching and result in badness in subsequent etching processes.

Embodiment of the present invention provides a mask, which can solve the over-etching problem caused by difference between thicknesses of photoresist in different regions.

Figure 3:
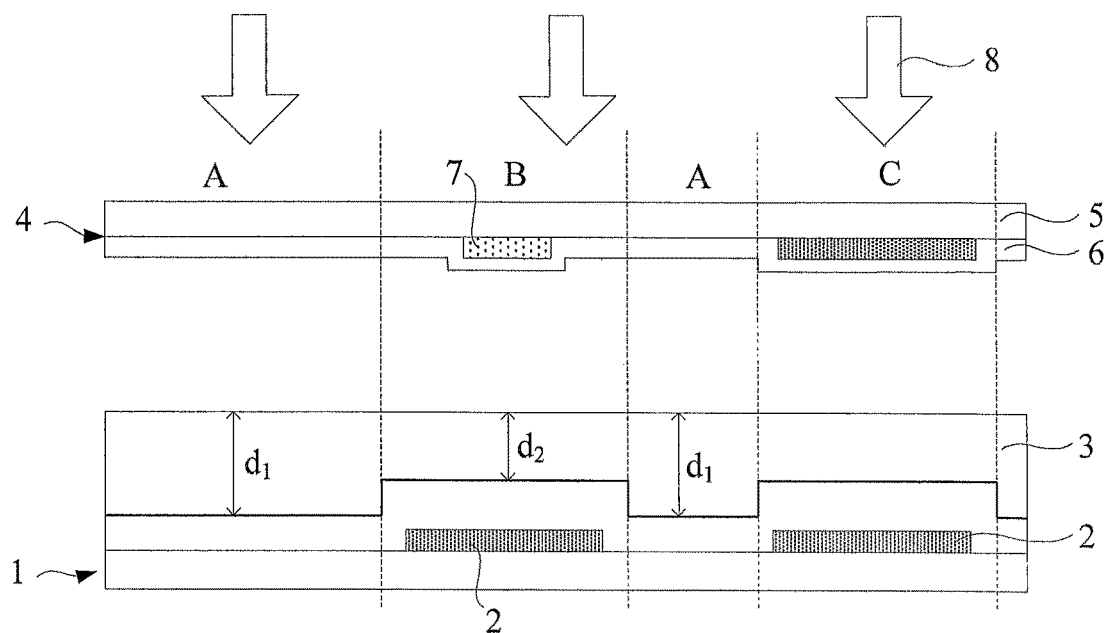
FIG. 3 is a schematic diagram of exposure process of a mask according to an embodiment of the present invention.
Figure 4:
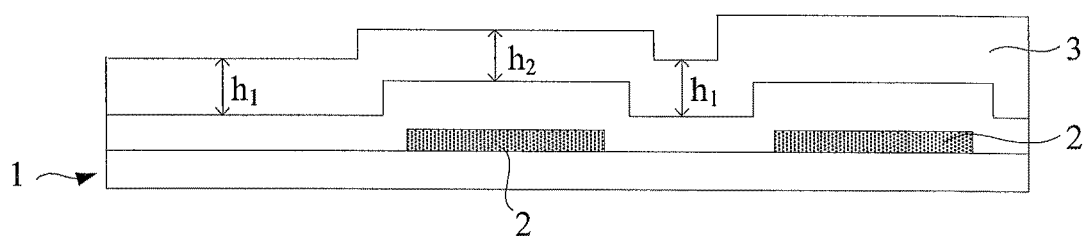
FIG. 4 is a distribution schematic diagram of photoresist of a developed substrate as shown in FIG. 3.

For example, referring to FIGS. 3 and 4, FIG. 3 is a schematic diagram of exposure process of a mask according to an embodiment of the present invention; and FIG. 4 is a distribution schematic diagram of the photoresist of the developed substrate as shown in FIG. 3.

As shown in FIG. 3, the embodiment of the present invention provides a mask 4, the mask 4 comprises an opaque region C; a first semi-transparent region A; and a second semi-transparent region B; wherein a transmittance of the second semi-transparent region B is less than that of the first semi-transparent region A.

Before the substrate 1 is coated with photoresist 3, a region of its surface, at which a metal wire 2 is arranged, is higher than another region of its surface, at which no metal wire 2 is arranged. Therefore, after the substrate 1 is coated with photoresist 3, the photoresist 3 coated on the region at which the metal wire 2 is arranged has a thickness $d_2$, the photoresist 3 coated on the region at which no metal wire 2 is arranged has a thickness $d_1$, wherein $d_2$ is less than $d_1$. When the above mask 4 directly faces the substrate 1, the first semi-transparent region A covers a region of the substrate 1, at which region no metal wire 2 is arranged and which requires to be semi-exposed; and the second semi-transparent region B covers a region of the substrate 1, at which region a metal wire 2 is arranged and which requires to be semi-exposed. Therefore, during the exposure procedure, light 8 from a light source, for example, an ultraviolet ray, passes through the first semi-transparent region A so that the photoresist 3 of the region, at which no metal wire 2 is arranged and which requires to be semi-exposed, is semi-exposed; and the ultraviolet ray passes through the second semi-transparent region B so that the photoresist 3 of the region, at which a metal wire 2 is arranged and which requires to be semi-exposed, is semi-exposed. Since the transmittance of the second semi-transparent region B in the mask 4 is less than that of the first semi-transparent region A, after exposed, the exposure to the photoresist 3 on the region corresponding to the second semi-transparent region B is less than the exposure to the photoresist 3 on the region corresponding to the first semi-transparent region A. Therefore, after the exposed photoresist 3 is developed, the removed photoresist 3 in thickness corresponding to the second semi-transparent region B is less than that of the removed photoresist 3 corresponding to the first semi-transparent region A, so that the difference between the thickness $h_2$ of the remained photoresist 3 corresponding to the second semi-transparent region B and the thickness $h_1$ of the remained photoresist 3 corresponding to the first semi-transparent region A is reduced. In such a manner, even if the thickness $h_1$ of the remained photoresist 3 on the region covered by the first semi-transparent region A were very thin, it would have photoresist 3 to protect the region of the substrate 1 covered by the second semi-transparent region B after developed. It can reduce the possibility of over-etching to the region of substrate 1 covered by the second semi-transparent region B in a subsequent etching process. That is, it can reduce the possibility of over-etching to the region of the substrate, at which region a metal wire 2 is arranged and which requires to be semi-exposed.

Therefore, the above mask 4 can solve the over-etching problem caused by the difference between the thicknesses of photoresist 3 in different regions.

According to embodiments of the present invention, there are a plurality of manners to allow of the transmittance of the second semi-transparent region B less than that of the first semi-transparent region A.

For example, manner 1: as shown in FIG. 3, a semi-transparent film 6 is arranged on the regions of the substrate 5 which correspond to the first semi-transparent region A and the second semi-transparent region B, and the portions of the semi-transparent film 6 that cover the regions of the first semi-transparent region A and the second semi-transparent region B have same transmittance. A light shielding layer 7 is arranged on the position of the second semi-transparent region B covered by the semi-transparent film 6, which has a width less than resolution size of the exposure machine.

Since the width of the light shielding layer 7 is less than the resolution size of the exposure machine, the light 8, for example, an ultraviolet ray, will be diffracted by the light shielding layer 7 when it irradiates on the second semi-transparent region B, so that the transmittance of the second semi-transparent region B is less than that of the first semi-transparent region A.

Manner 2: a first semi-transparent film is arranged on the region of substrate 5 of the mask opposite to the first semi-transparent region A; and a second semi-transparent film is arranged on the region of substrate 5 of the mask opposite to the second semi-transparent region B; wherein the transmittance of the first semi-transparent film is larger than that of the second semi-transparent film.

In the above manner 1, for example, the light shielding layer 7 is made of metal material; or the light shielding layer 7 is made of black matrix material. The light shielding layer can be made of other opaque materials.

In the above manner 1, for example, the light shielding layer 7 has a width of 1-2 µm.

It is understood that the described above are only illustrative embodiments, and the present invention is not intended to limited thereto. For one of ordinary skill in the art, various modifications and improvements may be made without departing from the spirit and scope of embodiments of the present invention, and all of which should fall within the protection scope of the present invention.

What is claimed is:

1. A mask, comprising:
  a substrate;
  an opaque region;
  a first semi-transparent region;
  a second semi-transparent region;
  a semi-transparent film layer provided at portions of the substrate corresponding to the first semi-transparent region and the second semi-transparent region; and
  a light shielding layer provided in the portion of the semi-transparent film layer corresponding to the second semi-transparent region;

wherein the light shielding layer is disposed below the substrate and covered by the portion of the semi-transparent film layer corresponding to the second semi-transparent region, and has a width 1-2 μm less than resolution size of the exposure machine, to allow light from a light source to be diffracted by the light shielding layer when it irradiates on the second semi-transparent region.

2. The mask according to claim 1, wherein transmittance of the second semi-transparent region is less than that of the first semi-transparent region, and the portions of semi-transparent film layer that cover the first semi-transparent region and the second semi-transparent region have same transmittance.

3. The mask according to claim 2, wherein the light shielding layer is made of metal material.

* * * * *